United States Patent
Guha et al.

(10) Patent No.: US 7,820,474 B2
(45) Date of Patent: Oct. 26, 2010

(54) METAL CATALYZED SELECTIVE DEPOSITION OF MATERIALS INCLUDING GERMANIUM AND ANTIMONY

(75) Inventors: Supratik Guha, Chappaqua, NY (US); Fenton R. Mc Feely, Ossining, NY (US); John J. Yurkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 11/621,389

(22) Filed: Jan. 9, 2007

(65) Prior Publication Data

US 2008/0166586 A1      Jul. 10, 2008

(51) Int. Cl.
  *H01L 21/00*  (2006.01)

(52) U.S. Cl. ............ 438/95; 257/E21.17; 257/E21.586; 438/492

(58) Field of Classification Search ............ 257/E21.17, 257/E21.586; 438/95, 492
See application file for complete search history.

(56) References Cited

U.S. PATENT DOCUMENTS

| | | | |
|---|---|---|---|
| 3,200,490 A | 8/1965 | Clymer | |
| 6,416,837 B1 * | 7/2002 | Kojima et al. | 428/64.1 |
| 7,314,776 B2 * | 1/2008 | Johnson et al. | 438/95 |
| 7,405,420 B1 * | 7/2008 | Wong et al. | 257/4 |
| 2006/0172067 A1 * | 8/2006 | Ovshinsky et al. | 427/248.1 |
| 2008/0020564 A1 | 1/2008 | Bae et al. | |

FOREIGN PATENT DOCUMENTS

| | | |
|---|---|---|
| DE | 2359640 | 6/1975 |
| DE | 2930789 | 2/1980 |
| EP | 1039448 | 9/2000 |

* cited by examiner

*Primary Examiner*—Asok K Sarkar
(74) *Attorney, Agent, or Firm*—Scully, Scott, Murphy & Presser, P.C.; Vazken Alexanian

(57) ABSTRACT

A chemical vapor deposition (CVD) method for selectively depositing GeSb materials onto a surface of a substrate is provided in which a metal that is capable of forming an eutectic alloy with germanium is used to catalyze the growth of the GeSb materials. A structure is also provided that includes a GeSb material located on preselected regions of a substrate. In accordance with the present invention, the GeSb material is sandwiched between a lower metal layer used to catalyze the growth of the GeSb and an upper surface metal layer that forms during the growth of the GeSb material.

19 Claims, 4 Drawing Sheets

METAL CATALYZED SELECTIVE DEPOSITION OF MATERIALS INCLUDING GERMANIUM AND ANTIMONY

FIELD OF THE INVENTION

The present invention relates to semiconductor devices and semiconductor device fabrication. More particularly, the invention relates to a chemical vapor deposition (CVD) method for the selective deposition of a material that comprises germanium (Ge) and antimony (Sb) onto a surface of a substrate. The present invention also relates to structures which include a layer of the material comprising Ge and Sb.

BACKGROUND OF THE INVENTION

Materials which may, via suitable temperature excursions, be reversibly switched between two structural phases characterized by different resistivities, have the potential to be employed as phase change memory materials. One such class of materials is a material that includes germanium (Ge) and antimony (Sb). Hereinafter the materials including Ge and Sb are referred to as GeSb materials.

In order to fabricate practical memory devices, it will be necessary to deposit the GeSb materials upon substrates of substantial topography complexity. A possible structure for implementing a phase change memory device is a line-and-via structure similar to those found in interconnect wiring structures. In such structures, the phase change material in the narrow via opening would constitute the active element of the memory device.

One promising candidate method for deposition of GeSb materials is chemical vapor deposition. In CVD, numerous organometallic precursors (such as carbonyls, alkyls, etc.) with reasonable vapor pressure exist for a large number of candidate metals. A useful feature of some, but not all, CVD process is selectivity. By this it is meant that the deposition reaction can be carried out such that a material is deposited only on specific underlying materials on the substrate, while not depositing on other materials on the substrate, despite their exposure to the reactant gas at the reaction temperature. Common examples of such CVD process are the selective growth of Si on Si, but with no growth on co-present $SiO_2$ and the growth of W on Si, but also not on $SiO_2$.

The problem to be faced with conventional CVD methods is in performing the deposition at sufficiently low temperature (less than about 400° C.) while still maintaining the desired selectivity mentioned above.

To date, there is no known chemical vapor deposition (CVD) method for depositing GeSb materials onto a substrate at temperatures less than 400° C. having the desired feature of selectivity. As such, there is a need for the development of a chemical vapor deposition method in which the deposition method has the ability to form GeSb materials onto selective areas of a substrate.

SUMMARY OF THE INVENTION

The present invention provides a chemical vapor deposition (CVD) method for selectively depositing GeSb materials onto a surface of a substrate. In some embodiments, the inventive method has the ability to fill high aspect ratio openings. The term "high aspect ratio" is used herein to denote an opening that has a height to width ratio that exceeds 3:1. The term "opening" denotes a line opening, a via opening, a combined line/via structure, a trench, etc. which can be fabricated using lithography and etching. In other embodiments, the present invention provides a CVD method for selectively depositing a GeSb material onto at least one preselected surface of a substrate. The preselected surface may be located on, or within, the substrate.

The CVD method of the instant invention permits for the control of GeSb stoichiometry over a wide range of values and the inventive method is performed at a substrate temperature of less than 400° C., which makes the inventive method compatible with existing interconnect processes and materials. In accordance with the present invention, GeSb materials can be formed of the basic formula $Ge_xSb_y$ wherein x is from about 2 to about 98 atomic %, and y is from about 98 to about 2 atomic %.

As stated above the inventive method is a selective CVD process, which means that the GeSb material is deposited on some surfaces of the substrate while not being deposited on other surfaces of the substrate. In particular, the present invention, is applicable for selectively depositing GeSb materials onto an insulating, i.e., dielectric, material. For the production of line-and-via (line/via) structures including GeSb materials this is advantageous, as the via sidewalls would not require any special activation process prior to the deposition of the GeSb materials.

In general terms, the method of the present invention comprises:

positioning a substrate in a chemical vapor deposition reactor chamber, said substrate including a region that contains a metal that is capable of forming an eutectic alloy with germanium;

evacuating said reactor chamber including said substrate to a base pressure of less than 1E-3 torr, and preferably less than 1E-6 torr;

heating the substrate to a temperature that is less than 400° C.;

providing an antimony-containing precursor and a germanium-containing precursor to said reactor chamber; and depositing a material comprising germanium (Ge) and antimony (Sb) onto said region of the substrate that contains said metal from said precursors.

In some embodiments of the present invention, the substrate is an interconnect dielectric material that has at least one opening that has an aspect ratio of greater than 3:1 and the inventive method has the ability to selectively fill the at least one opening with a GeSb material. In this embodiment of the present invention, the metal that is capable of forming an eutectic alloy with germanium is present at the bottom of the at least one opening. In other embodiments, the substrate has a substantially planar surface and the inventive method has the ability to selectively deposit a GeSb material on preselected regions of the substrate that includes said metal.

In addition to the above method, the present invention also contemplates a method wherein the metal and the material comprising Ge and Sb are deposited in the same reactor within breaking vacuum. This aspect of the present invention comprises:

positioning a substrate in a chemical vapor deposition reactor chamber;

evacuating said reactor chamber including said substrate to a base pressure of less than 1E-3 torr, and preferably less than 1E-6 torr;

heating the substrate to a temperature that is less than 400° C.;

forming a metal that is capable of forming an eutectic alloy with germanium on a region of said substrate;

providing an antimony-containing precursor and a germanium-containing precursor to said reactor chamber; and depositing a material comprising germanium (Ge) and antimony (Sb) onto said region of the substrate that contains said metal from said precursors.

In a highly preferred embodiment of the present invention, the method of the present invention comprises:

positioning an insulating material in a chemical vapor deposition reactor chamber, said insulating material including a region that contains Au;

evacuating said reactor chamber including said interconnect structure to a base pressure of less than 1E-3 torr;

heating the interconnect structure to a temperature that is less than 400° C.;

providing an antimony-containing precursor and a germanium-containing precursor to said reactor chamber; and depositing a material comprising germanium (Ge) and antimony (Sb) on said regions of said insulating material containing Au from said precursors.

In addition to a CVD method for the selective deposition of GeSb materials, the present invention also relates to a semiconductor structure including the GeSb materials formed utilizing the inventive method. In general terms, the semiconductor structure of the present invention comprises:

a substrate including a region that contains a metal; and a material comprises Ge and Sb on said metal, wherein said material includes a surface layer of said metal that has a thickness of less than 5 monolayers.

The term "monolayer" is used herein to denote a surface layer of said metal that is one atom thick.

In accordance with the present invention, the GeSb material is sandwiched between a lower metal layer used to catalyze the growth of the GeSb and an upper surface metal layer that forms during the growth of the GeSb material. If, prior to the initiation of deposition, the metal is sufficiently thin, the lower metal layer may be vanishingly thin.

DETAILED DESCRIPTION OF THE INVENTION

The present invention, which provides a metal catalyzed CVD method for the selective deposition of GeSb materials and the structure formed by the same, will now be described in greater detail by referring to the following discussion and drawings that accompany the present application. It is noted that the drawings of the present application are provided for illustrative purposes and, as such, the drawings are not necessarily drawn to scale.

Figure 1:
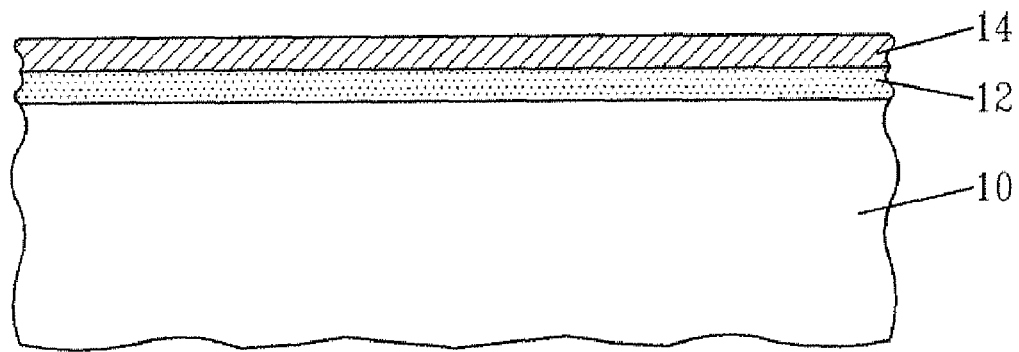
FIG. 1 is a pictorial representation (through a cross sectional view) illustrating an initial structure that can be employed in the present invention prior to the selective chemical vapor deposition of a GeSb material.

Reference is first made to FIG. 1 which illustrates an exemplary substrate 10 that can be employed in the present invention. Specifically, the illustrated substrate 10 is an insulating, i.e., dielectric, material which has a substantially planar surface which optionally includes an intermediate adhesion layer 12. In the embodiment shown, a metal 14 is located atop the intermediate adhesion layer 12. In other embodiments, the metal 14 can be formed directly atop the substrate 10 when the intermediate adhesion layer 12 is not present.

In yet other embodiments, the substrate 10 is an interconnect structure that includes at least one opening formed in a dielectric material. In accordance with the present invention, the at least one opening has an aspect ratio of greater than 3:1. The at least one opening may include a via, a line, a trench, combined line/via structure, etc.

In the cases in which the initial substrate 10 includes a dielectric material, the dielectric material comprises any insulating material that is used as an interlevel dielectric in interconnect technology. Typically, the dielectric material has a dielectric constant (as measured in a vacuum) of about 4.0 or less, with a dielectric constant of about 3.7 or less being even more typical. Examples of such insulating materials that can be used in the present invention as dielectric material include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

Although not shown, the substrate 10 can be typically located upon a second substrate. The second substrate, which is not shown, may comprise a semiconducting material, an insulating material, a conductive material or any combination thereof. When the second substrate is comprised of a semiconducting material, any semiconductor such as Si, SiGe, SiGeC, SiC, Ge alloys, GaAs, InAs, InP and other III/V or II/VI compound semiconductors may be used. In additional to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the second substrate is an insulating material, the insulating material can be an organic insulator, an inorganic insulator or a combination thereof including multilayers. When the second substrate is a conductive material, the second substrate may include, for example, polySi, an elemental metal, alloys of elemental metals, a metal silicide, a metal nitride or combinations thereof including multilayers. When the second substrate comprises a semiconducting material, one or more semiconductor devices such as, for example, complementary metal oxide semiconductor (CMOS) devices can be fabricated thereon. When the second substrate comprises a combination of an insulating material and a conductive material, the substrate may represent a first interconnect level of a multilayered interconnect structure.

When at least one opening is formed into the substrate 10, it is typically formed utilizing lithography and etching. The lithographic process includes forming a photoresist atop a hard mask material (e.g., an oxide and/or a nitride) that is typically located atop the substrate 10, exposing the photoresist to a desired pattern of radiation and developing the exposed resist. The etching process comprises wet chemical etching and/or dry chemical etching. Of these types of etching processes, a dry chemical etching process such as reactive ion etching, ion beam etching or plasma etching is preferred. In the case of a line/via structure, a conventional via-first then line process may be employed. Alternatively, a line-first then via process is also contemplated in the present invention.

As stated above, substrate 10 may include an optional intermediate adhesion layer 12. The optional intermediate adhesion layer 12 comprises a metal or metal nitride. Examples of suitable metals for the optional intermediate adhesion layer include, but are not limited to: Ti, Ta, Ru, and W.

The optional adhesion layer 12 can be formed utilizing a conventional deposition process including, for example, chemical vapor deposition (CVD), plasma enhanced chemical vapor deposition (PECVD), evaporation, sputtering, plating, metalorgano deposition, and chemical solution deposition. In some embodiments of the present invention, the intermediate adhesion layer 12 can be formed in the same reactor chamber as that of the GeSb material without breaking vacuum between depositions.

When present, the optional intermediate adhesion layer 12 typically has a thickness from about 1 to about 6 nm, with a thickness from about 2 to about 4 nm being even more typical.

In the embodiment shown in FIG. 1, a metal 14 is located atop the intermediate adhesion layer 12. In other embodiments, the metal 14 can be formed directly atop the substrate 10 when the intermediate adhesion layer is not present. Notwithstanding which embodiment is employed, the metal 14 comprises any metal that is capable of forming an eutectic alloy with germanium. Illustrative examples of such metals that are capable of forming an eutectic alloy with germanium include, but are not limited to: Au, Al, and Sn. Preferably, Au or Al are employed as the metal 14. More preferably, Au is employed as the metal 14.

The metal 14 may be formed selectively on preselected regions (or areas) of the substrate 10 in which the GeSb material will be subsequently formed. In the embodiment illustrated, the metal 14 is formed entirely across the structure including the intermediate adhesion layer 12 and the substrate 10. In yet other embodiments, the metal 14 may be located on or within a specific region of the structure including substrate 10.

In some embodiments, the metal 14 may be formed on a second substrate prior to depositing a dielectric material as substrate 10. In such an embodiment, the metal 14 would be present entirely underneath the dielectric material and when an opening is formed in the dielectric material a portion of the metal 14 is exposed.

The metal 14 is formed by a conventional deposition process including, for example, CVD, PECVD, sputtering, electroless plating, electroplating, evaporation, chemical solution deposition and metalorgano deposition. In some embodiments, the metal 14 is formed within the same reactor chamber as that of the GeSb material and the depositions occur without breaking vacuum. In some embodiments, deposition, lithography and etching can be used in forming the metal 14 on selective areas of the substrate 10, which may optionally include the intermediate adhesion layer 12.

The thickness of the metal 14 that is used in 'catalyzing' the selective deposition of GeSb materials may vary depending on the material used as well as the deposition process used in forming the same. Typically, the metal 14 has a thickness from about 1 to about 50 nm, with a thickness from about 3 to about 10 nm being even more typical.

Figure 2:
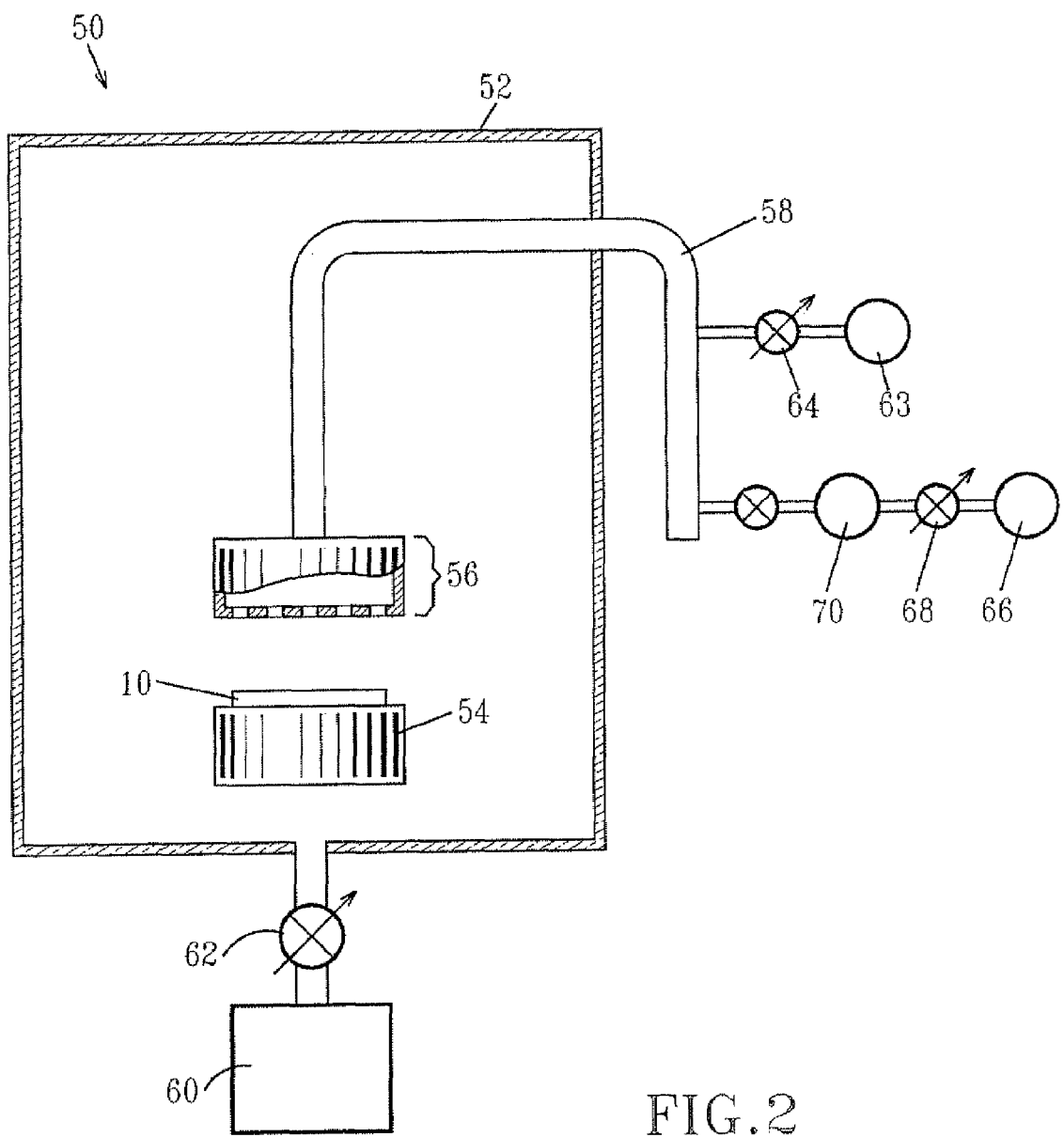
FIG. 2 is a schematic of a chemical vapor deposition apparatus that can be used in one embodiment of the present invention for the selective deposition of GeSb materials.

Reference is now made to FIG. 2 which illustrates a typical chemical vapor deposition (CVD) reactor 50 that may be employed in the present invention to deposit the GeSb material on or with a region of the substrate 10. It is noted that although reference is made to the chemical vapor deposition reactor 50 illustrated in FIG. 2, the present invention is not limited to utilizing only such a reactor. Instead, the present invention may be performed utilizing other types of chemical vapor deposition reactors that are well known to those skilled in the art. Other types of reactors that can be employed in the present invention are elaborated further herein below.

Referring back to CVD reactor 50, the CVD reactor 50 includes a reactor chamber 52 in which the initial structure is positioned within. The reactor chamber 52 is typically a vacuum enclosure including, a substrate holder 54, a showerhead 56 that is connect to an intake manifold 58, and a vacuum pump 60, such as a turbo molecular pump, that can be open or shut by a valve 62.

In accordance with the present invention, the initial structure including substrate 10 such as shown in FIG. 1 is positioned on a surface of the substrate holder 54 that is located within the CVD) reactor chamber 52. A distance from about 10 to about 80 mm typically separates the initial structure from the showerhead 56. Although such a distance is specifically mentioned, the present invention is not limited to the recited distance.

With the initial structure positioned within the reactor chamber 52, the pressure within the reactor chamber 52 is evacuated to a base pressure of less than 1E-3 torr, with a base pressure of less than 1E-6 torr being more preferred. The evacuation to this base pressure is achieved by opening the value 62 to vacuum pump 60.

In some embodiments of the present invention, the substrate holder 54 typically includes a heating element which is capable of heating the initial structure during the subsequent deposition of the Ge-containing and Sb-containing precursors. In accordance with the present invention, the heating element is capable of heating the initial structure to a temperature that is less than 400° C., with a temperature from about 250° to about 375° C. being even more typical.

Ge-containing and Sb-containing precursors are then directed to the heated structure by means of showerhead 56. In accordance with the particular embodiment shown, the precursors are introduced as a gas mixture to the showerhead 56 through intake manifold 58. The precursor gas mixture is formed by admitting a flow of a Ge-containing precursor typically, but not necessarily, in an inert gas from source 63 by means of a mass controller 64 and by flowing an inert gas from source 66 through mass flow controller 68 through bubbler 70 that includes a Sb-containing precursor. Preferably, the Ge-containing precursor is a neat Ge-containing precursor, i.e., it does not include an inert gas. The term "inert gas" is used in the present application to denote a gas which does not participate in the formation of the GeSb material. Examples of such inert gases include Ar, Ne, $N_2$, $H_2$, and He, with Ar being highly preferred.

In accordance with the present invention, the Ge-containing precursor comprises any compound or complex which includes Ge. Examples of Ge-containing precursors include germanes such as monogermane, digermane, trigermane and higher germanes, germane alkyls containing from 1 to about 16 carbon atoms, germane hydrides, and other organo-germanes. Preferably, the Ge-containing precursor is germane or a germanium alky containing 1 to about 6 carbon atoms such as, for example, tert-butyl germane.

The Sb-containing precursor that can be employed in the present invention comprises any compound or complex that includes Sb. Illustrative examples of such precursors include antimony alkyls containing from 1 to about 16 carbon atoms, antimony amines, antimony hydrides and other organo-antimony containing compounds. In one preferred embodiment of the present invention, the Sb-containing precursor is tris (dimethylamino) antimony.

The flow of the two precursors gases employed in the present invention may vary depending on the desired stoichiometry of the resultant GeSb material. In accordance with the present invention, the flow of the Ge-containing precursor without the presence of an inert gas is from about 1 to about 1000 sccm, while a flow of about 10 to about 300 sccm of inert gas containing the Sb-containing precursor is employed. When an inert gas is present with the Ge-containing precursor, the flow of Ge-containing precursor is typically greater than the flow reported above for the neat Ge-containing precursor. In a preferred embodiment of the present invention, the flow of the neat Ge-containing precursor gas is from about 2 to about 150 sccm, while a flow of about 15 to about 50 sccm of inert gas containing the Sb-containing precursor is employed. In a highly preferred embodiment, about 5 sccm of 20% germane is employed, while 20 sccm of Ar containing 20 ml of tris(dimethylamino) antimony is employed. It is understood that flows described above apply to the particular reactor employed. Were another reactor to be employed, e.g., with different volumes delivery line conductance and pumping speed, the preferred flows could deviate substantially from those given above.

It is noted that during the course of the deposition process the pressure within the reactor chamber 52 is maintained at a deposition pressure from about 1 to about 10 torr. Typically, the deposition pressure within the reactor is maintained at a value from about 6 to about 8 torr during the deposition process.

It is further noted that instead of mixing the two precursors gasses in a single input manifold as described above and as is illustrated in FIG. 2, the inventive method works equally well for cases where separate manifolds are used for each precursor gas and mixing thereof can take place in the showerhead itself, or in the space between the showerhead and the initial structure. The later is referred to as a post-mixing scheme.

The precursors are typically provided to the initial structure 10 as a gas mixture, i.e., simultaneously. Although simultaneous contact is typically preferred, the present invention also can be employed when a layer of Ge is first provided utilizing the Ge-containing precursor and then the Sb-containing precursor is provided.

In accordance with the present invention, a deposition rate of about 10 to about 1000 nm/min of a material comprising Ge and Sb can be achieved, with a deposition rate of from about 20 to about 150 nm/min being even more preferred.

Figure 3:
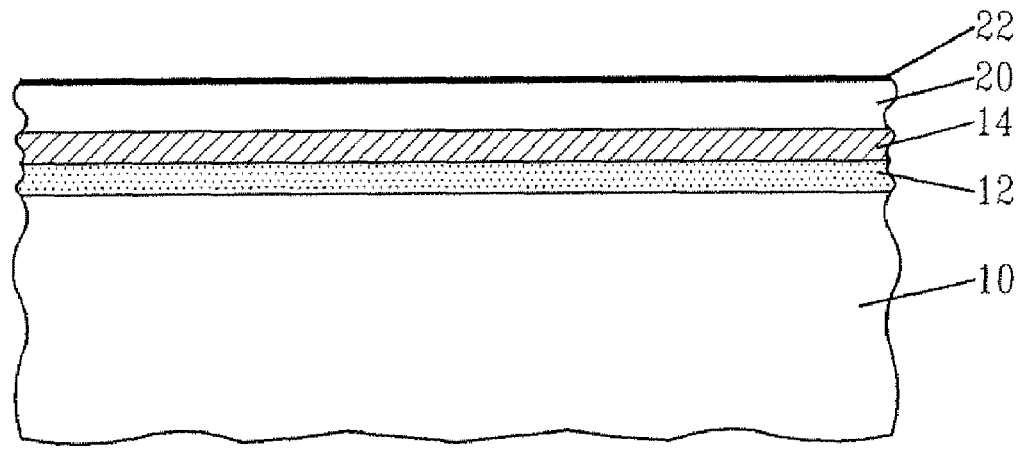
FIG. 3 is a pictorial representation (through a cross sectional view) after selective deposition of a GeSb material onto a selective region of the structure utilizing the method of the present invention.

Under the details described above, the present invention forms a material comprising Ge and Sb that selectively deposition on the metal 14 resulting in the structure shown in FIG. 3. In FIG. 3, reference numeral 20 denote the material comprising Ge and Sb. In accordance with the present invention, the GeSb material 20 has the formula $Ge_xSb_y$, wherein x is from about 2 to about 98 atomic % Ge, and y is from about 98 to about 2% Sb. More preferably, the GeSb material 20 provided in the present invention is one wherein x, the atomic percent Ge, is from about 10 to about 20 atomic %, and y, the atomic percent Sb, is from about 90 to about 80 atomic In addition to forming the GeSb material 20, a surface layer of metal 22 forms on the GeSb material 20. In accordance with the present invention, the surface layer of metal 22 comprises the same metal as that of metal layer 14 which is also present in the structure shown in FIG. 3. The surface layer of metal 22 has a thickness that is less than 5 monolayers thick, with a thickness from about 1 to about 3 monolayers being preferred. The surface layer of metal 22 forms on the surface of GeSb material 20 during the growth of layer 20.

The following example illustrates the present invention in more detail.

EXAMPLE

Figure 4:
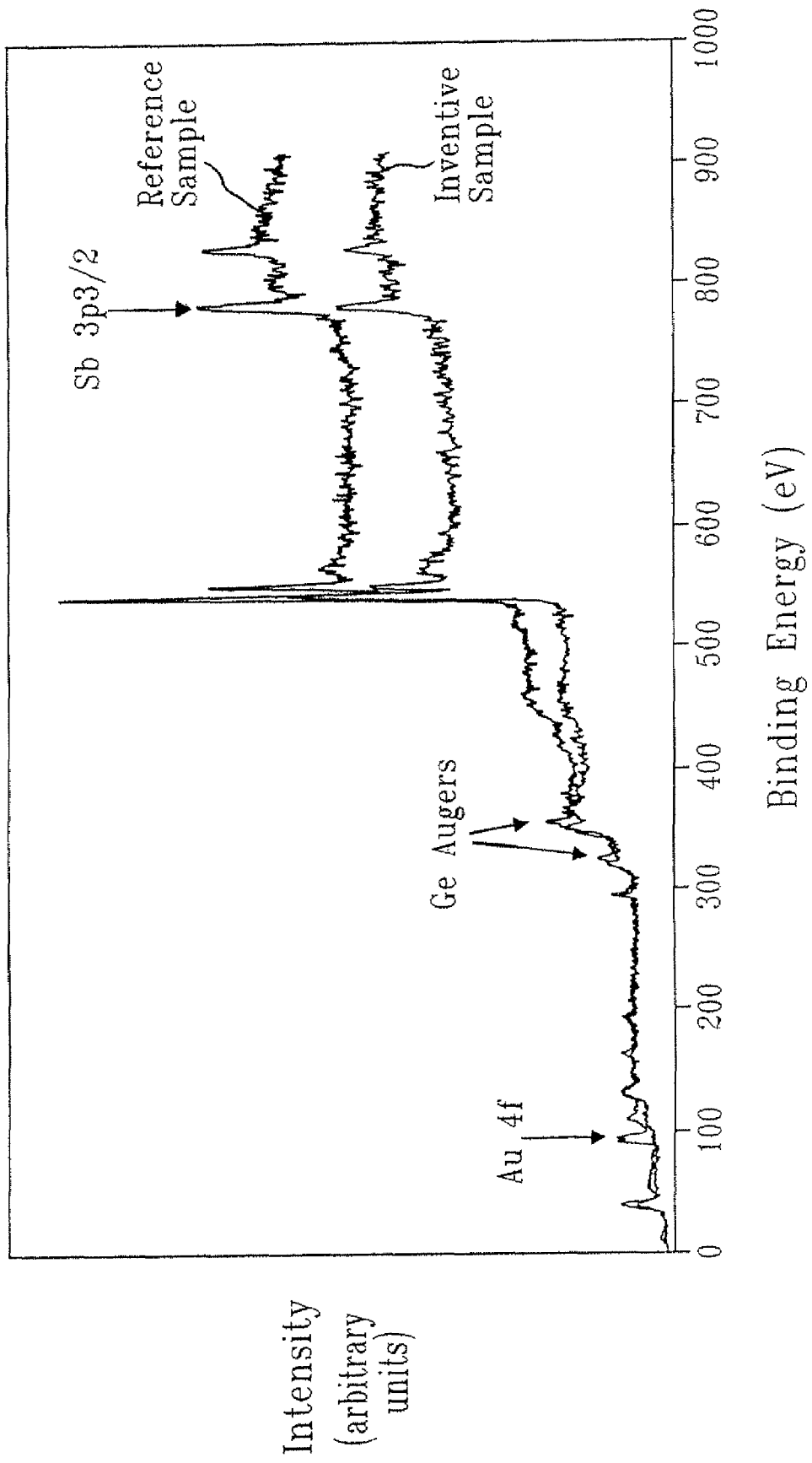
FIG. 4 shows an X-ray photoemission spectrum of a GeSb material grown on a Au surface compared to a reference sample of Ge(0.15)Sb(0.85).

In this example, a GeSb material was selectively deposited at 360° C. on a surface of a dielectric material utilizing a metal that is capable of forming an eutectic alloy with Ge as a catalyst for the selective deposition. It is noted that when GeSb materials were grown on a dielectric material, negligible film growth was observed for the conditions used in this example. When Au was deposition first on the dielectric material, GeSb materials were deposited with a growth rate in excess of 100 Å/min. FIG. 4 shows an X-ray photoemission spectrum of a GeSb material grown on a Au surface (Inventive Sample) compared to a reference sample of Ge(0.15)Sb (0.85). The intensities of the Ge and Sb features in the spectrum of the deposited film indicated that the composition obtained was roughly the same as that of the reference sample. One additional feature of the spectrum was the appearance of peak due to the Au 4f level, This peak does not arise from gold underneath the film but rather from a thin layer of gold that floats on the surface of the film during growth. It is believed that the aforementioned phenomenon is essential to the inventive deposition process.

At the temperatures employed, the Ge precursor was not simply reactive with a dielectric surface, or with the GeSb material itself. Accordingly, no significant amount of Ge was deposited when the substrate was a dielectric. In the absence of Ge deposition, the Sb has a difficult time nucleating, so the net result was no growth on the dielectric surface. The Ge precursor, was however, quite reactive with Au at the growth temperature. This allowed the deposition reaction to initiate. The Au had limited solubility for Ge, however, so it floated on the top of the film, allowing the growth to be sustained.

Figure 5:
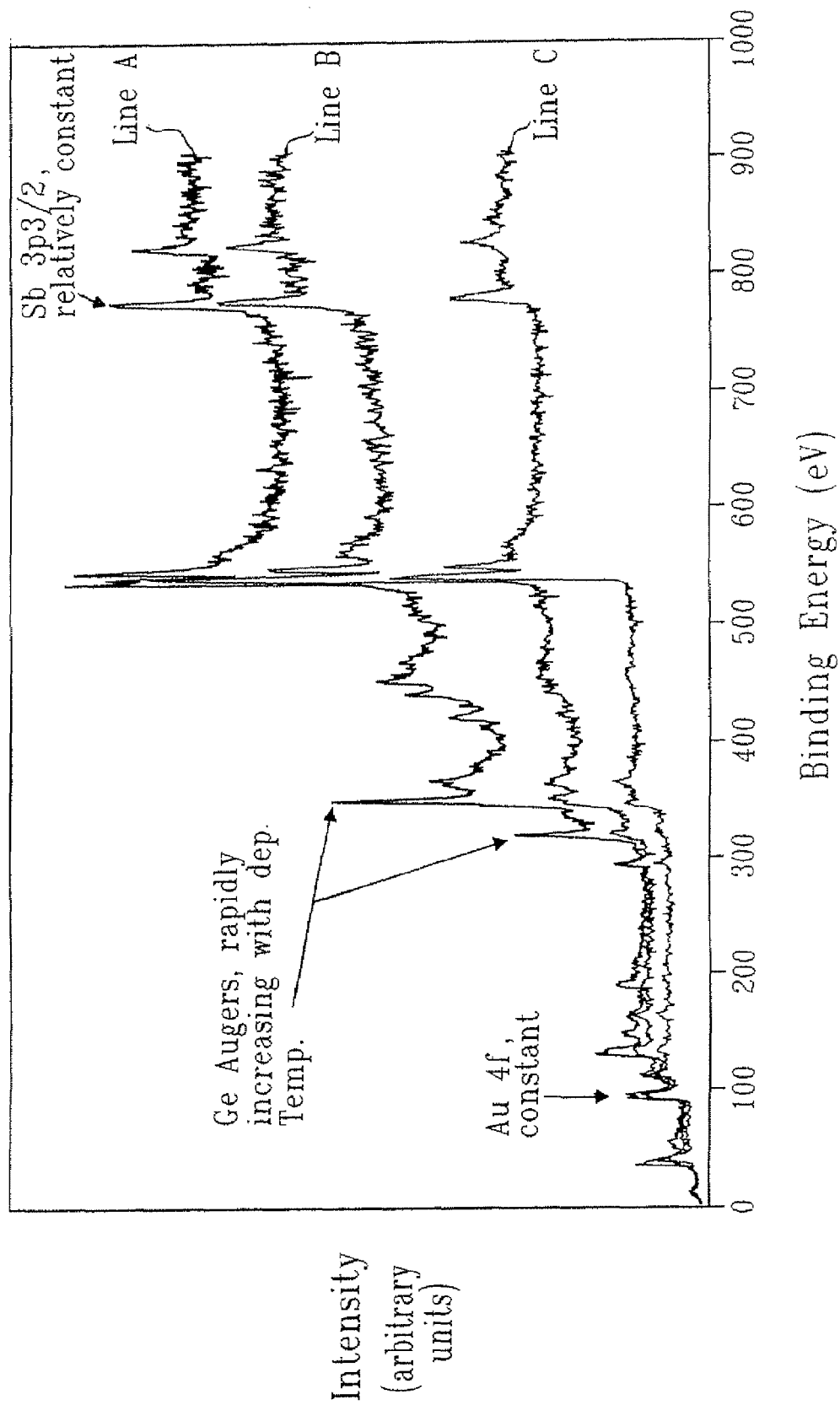
FIG. 5 is a graph plotting intensities vs. binding energies for various GeSb materials prepared by the inventive method at different deposition temperatures.

FIG. 5 shows that small excursions in growth temperature (Line A—370° C., Line B—360° C., and Line C—350° C.) allow the stoichiometry of the GeSb materials to be adjusted over a wide range. This may also be accomplished by suitable variations in the precursor gas mixture.

The above example shows that it is possible to selective deposit a GeSb material, at temperature of less than 400° C. utilizing the method of the present invention. In order for such selective deposition to occur, a metal such as Au is formed on a specified region of a substrate where a GeSb material is to be formed. GeSb is then deposited on the regions of the substrate including the metal.

While the present invention has been particularly shown and described with respect to preferred embodiments thereof, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method of selectively depositing a material comprising germanium and antimony comprising:
    positioning a substrate in a chemical vapor deposition reactor chamber, said substrate including a region that contains a metal that is capable of forming an eutectic alloy with germanium;
    evacuating said reactor chamber including said substrate to a base pressure of less than 1E-3 torr;
    heating the substrate to a temperature that is less than 375° C.;

providing an antimony-containing precursor and a germanium-containing precursor to said reactor chamber; and depositing a single material layer comprising both germanium (Ge) and antimony (Sb) onto said region of the substrate that contains said metal from said precursors at said temperature that is less than 375° C.

2. The method of claim 1 wherein said metal comprises Au, Al, Ge and In.

3. The method of claim 2 wherein said metal comprises Au.

4. The method of claim 1 wherein said region of said substrate including said metal is a bottom wall of at least one opening having an aspect ratio of greater than 3:1.

5. The method of claim 1 wherein said precursors are provided simultaneously to said reactor chamber.

6. The method of claim 1 wherein said germanium-containing precursor is a germane, a germane alkyl containing from 1 to about 16 carbon atoms, a germane hydride, or other organo-germanes.

7. The method of claim 1 wherein said antimony-containing precursor is an antimony alkyl containing from 1 to about 16 carbon atoms, an antimony amine, an antimony hydride or other organo-antimony containing compounds.

8. A method of selectively depositing comprising germanium (Ge) and antimony (Sb) comprising:

positioning a substrate in a chemical vapor deposition reactor chamber;

evacuating said reactor chamber including said substrate to a base pressure of less than 1E-3 torr;

heating the substrate to a temperature that is less than 375° C.;

forming a metal having a thickness of less than 5 monolayers on the substrate, wherein the metal is capable of forming a eutectic alloy with germanium on a region of said substrate;

providing an antimony-containing precursor and a germanium-containing precursor to said reactor chamber; and depositing a single material layer comprising both germanium (Ge) and antimony (Sb) onto said region of the substrate that contains said metal from said precursors at said temperature that is less than 375° C.

9. The method of claim 8 wherein said metal comprises Au, Al, Ge and In.

10. The method of claim 9 wherein said metal comprises Au.

11. The method of claim 8 wherein said region of said substrate including said metal is a bottom wall of at least one opening having an aspect ratio of greater than 3:1.

12. The method of claim 8 wherein said precursors are provided simultaneously to said reactor chamber.

13. The method of claim 8 wherein said germanium-containing precursor is a germane, a germane alkyl containing from 1 to about 16 carbon atoms, a geiinane hydride, or other organo-germanes.

14. The method of claim 8 wherein said antimony-containing precursor is an antimony alkyl containing from 1 to about 16 carbon atoms, an antimony amine, an antimony hydride or other organo-antimony containing compounds.

15. A method of selectively depositing a material comprising germanium (Sb) and antimony (Sb) comprising:

positioning an insulating material in a chemical vapor deposition reactor chamber, said insulating material including a region that contains Au;

evacuating said reactor chamber including said interconnect structure to a base pressure of less than 1E-3 torr;

heating the interconnect structure to a temperature that is less than 375° C.;

providing an antimony-containing precursor and a germanium-containing precursor to said reactor chamber; and depositing a single material layer comprising both germanium (Ge) and antimony (Sb) on said regions of said insulating material containing Au from said precursors at said temperature that is less than 375° C.

16. The method of claim 15 wherein said region of said substrate including said Au is a bottom wall of at least one opening having an aspect ratio of greater than 3:1.

17. The method of claim 15 wherein said precursors are provided simultaneously to said reactor chamber.

18. The method of claim 15 wherein said germanium-containing precursor is a germane, a germane alkyl containing from 1 to about 16 carbon atoms, a germane hydride, or other organo-germanes.

19. The method of claim 15 wherein said antimony-containing precursor is an antimony alkyl containing from 1 to about 16 carbon atoms, an antimony amine, an antimony hydride or other organo-antimony containing compounds.

* * * * *